United States Patent [19]

Hwang et al.

[11] 4,251,738
[45] Feb. 17, 1981

[54] BALANCED INPUT ZERO DIFFERENTIAL DETECTOR

[75] Inventors: Ying C. Hwang, Liverpool; John W. Lunden, Camillus, both of N.Y.

[73] Assignee: The United States of America as represented by the Secretary of the Air Force, Washington, D.C.

[21] Appl. No.: 932,815

[22] Filed: Aug. 10, 1978

Related U.S. Application Data

[63] Continuation-in-part of Ser. No. 751,238, Dec. 16, 1976, abandoned.

[51] Int. Cl.$^3$ .......................................... H03K 5/153
[52] U.S. Cl. .................... 307/231; 307/286; 307/354; 328/150
[58] Field of Search ............... 307/354, 355, 322, 363, 307/286, 231; 328/150, 115, 114

[56] References Cited

U.S. PATENT DOCUMENTS

| | | | |
|---|---|---|---|
| 3,136,902 | 6/1964 | Kerns | 307/363 |
| 3,187,273 | 6/1965 | Chasek | 332/1 |
| 3,348,068 | 10/1967 | Miller | 307/354 |
| 3,436,560 | 4/1969 | Marchais | 307/322 |
| 3,459,963 | 8/1969 | Saari | 307/355 |
| 3,553,496 | 1/1971 | Weiss | 307/286 |
| 3,560,763 | 2/1971 | Downey et al. | 307/354 |

Primary Examiner—John Zazworsky
Attorney, Agent, or Firm—Donald J. Singer; Willard R. Matthews

[57] ABSTRACT

A sensitive and precise detector is described for application in determining the "Centroid" of the video pulse of a radar return echo. A tunnel diode, connected and biased in a balanced configuration with respect to ground and selected taps on a signal delay line, is the key element of the circuit. The sum and/or difference of the tapped signals are formed in such a manner that a precise zero crossing, corresponding to the "centroid" of the pulse, may be determined. The special characteristics of the tunnel diode are utilized to achieve additional objects, base line noise immunity, multiple echo self resetting, and high speed-precision response. The tunnel diode is positioned in relation to four (or more) input signals and ground such that with no signal on the delay line, it is biased - at a stable low-current-high-voltage state. An incoming signal causes a series of state changes designed to "switch" the diode to a second state at the time of zero crossing, resulting in the occurrence of a voltage step which, in turn, causes the differential amplifier connected to the tunnel diode to also change state - with amplification.

3 Claims, 4 Drawing Figures

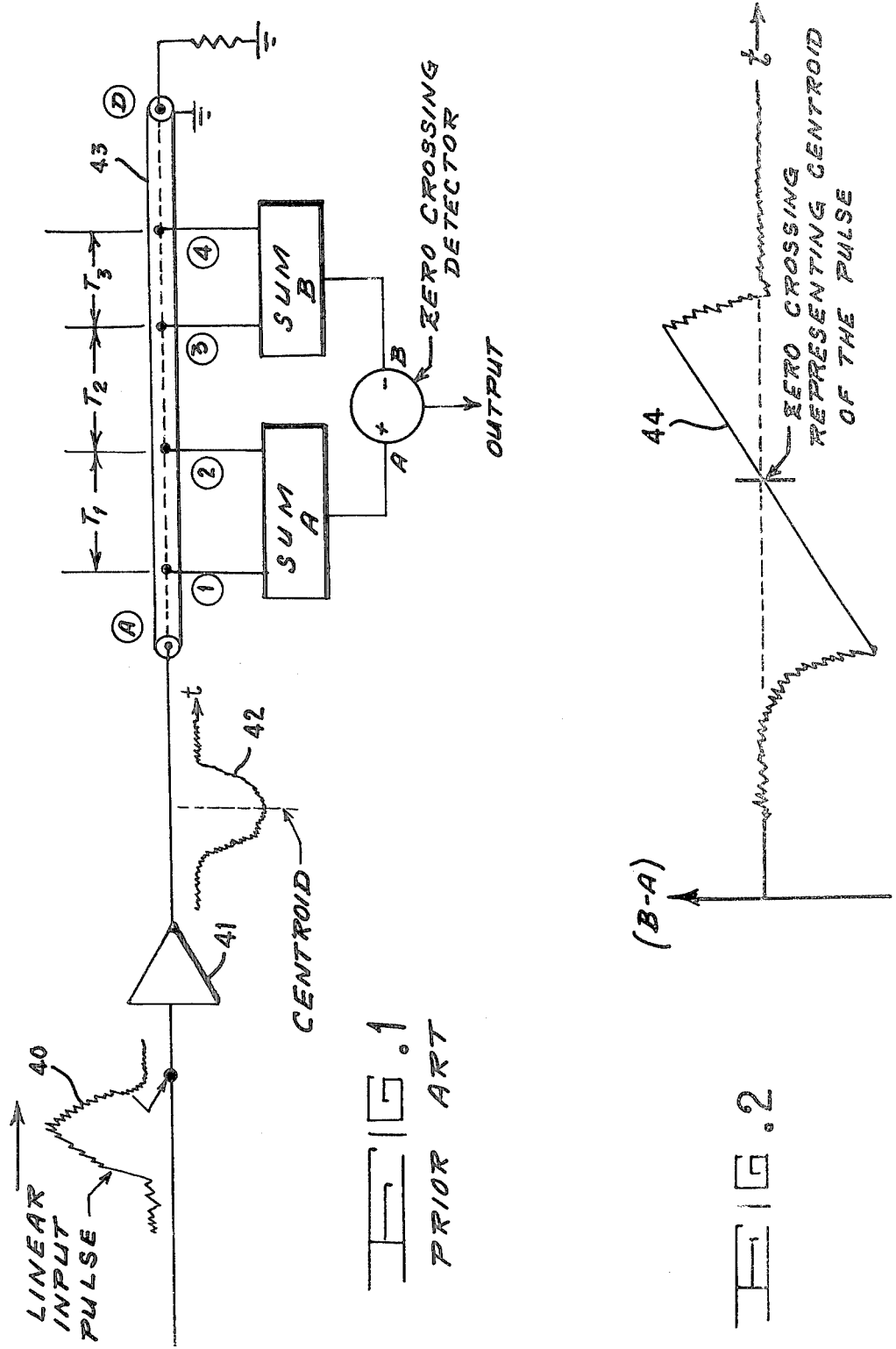

BALANCED INPUT ZERO DIFFERENTIAL DETECTOR

This is a continuation-in-part of co-pending patent Application Ser. No. 751,238, entitled *A Balanced Input Zero Differential Detector,* filed by Ying C. Hwang and John W. Lunden, Dec. 16, 1976 now abandoned.

STATEMENT OF GOVERNMENT INTEREST

The invention described herein may be manufactured and used by or for the Government for governmental purposes without the payment of any royalty thereon.

BACKGROUND OF THE INVENTION

This invention relates to radar signal processing circuits and in particular to a balanced input zero differential detector for determining the centroid of the video pulse of a returned echo.

In modern radar signal processing it is of interest to determine the "center of gravity" or centroid of the video pulse of a returned echo. A recognized practice is to use the following concept. First, the linear pulse signal with noise is amplified on a log-amplifier, which gives an output pulse with "cleaner" signal near the center. This compressed signal is fed to a terminated delay line along which a number of equally spaced taps are provided. Four taps, for example, may be utilized. The sum of the first group of taps is then compared with the sum of the second group of taps. Generally the difference between the first group and second group is shown as a curve in which the zero crossing represents the centroid of the incident pulse. A zero crossing detector is used to determine the point. Specifically, the task of the zero crossing detector is to determine a crossing "0" as precisely and as fast as possible without responding to the noise on the skirts of the pulse.

The zero crossing detector must have high time precision, high amplitude sensitivity and dynamic range, very fast response time and be insensitive to base line noise perturbations. It should be also able to reset itself automatically to enable proper response to multiple incoming signal pulses or echoes. The present invention is directed toward providing a differential detector that satisfies these requirements.

SUMMARY OF THE INVENTION

A balanced input zero differential detector is provided. A tunnel diode is mounted in a balanced fashion with respect to four input signals and ground. The balanced tunnel diode is coupled across the input of a differential amplifier. The tunnel diode is so connected and biased such that with no input signal or target echo it is electrically in a stable low-current-high-voltage state. An incoming signal causes a series of state changes designed to fire the diode at zero crossing resulting in the occurrence of a step voltage which in turn causes the differential amplifier to change state.

It is a principal object of the invention to provide a new and improved detector for determining the centroid of the video pulse of a radar return echo.

It is another object of the invention to provide a zero crossing detector having high time precision, high amplitude sensitivity and dynamic range.

It is another object of the invention to provide a zero crossing detector that has very fast response time and that is insensitive to base line noise perturbations.

It is another object of the invention to provide a zero crossing detector that is able to reset itself automatically to enable proper response to multiple incoming signal pulses.

These, together with other objects, features and advantages of the invention will become more readily apparent from the following detailed description when taken in conjunction with the illustrative embodiment in the accompanying drawings.

DESCRIPTION OF THE DRAWINGS

FIG. 1 is a schematic representation of prior art peak detection by centroid sum-difference method;

FIG. 2 illustrates a curve generated by the circuit of FIG. 1;

DETAILED DESCRIPTION OF THE PREFERRED EMBODIMENT

Figure 3:
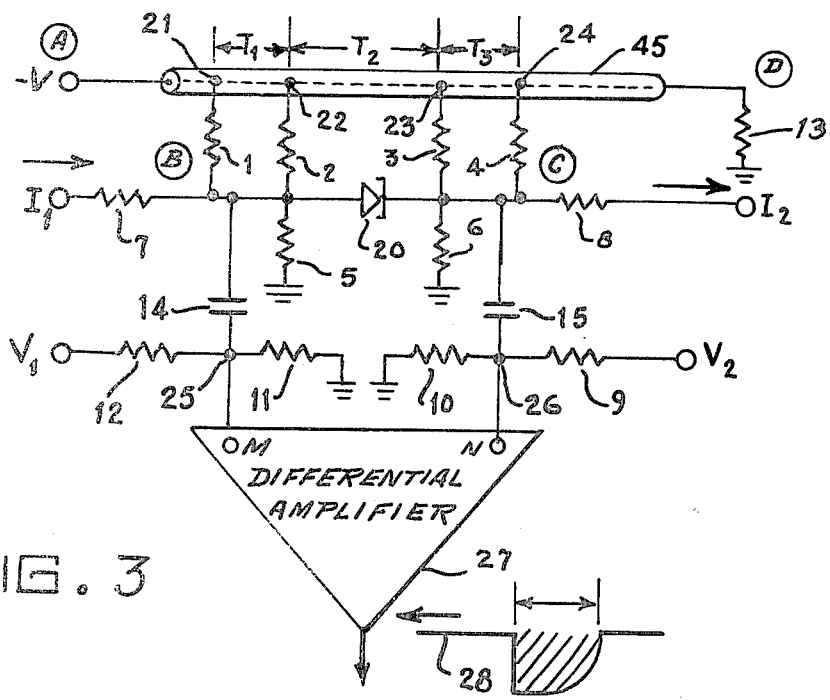
FIG. 3 illustrates a preferred embodiment of the balanced input zero differential detector circuit in accordance with the invention.

In modern radar signal processing it is of interest to determine the "centroid" of the video pulse of a returned echo to better determine the "effective center" of the target. A recognized practice is to use the concept illustrated by FIG. 1. First, the linear pulse signal 40 with noise is amplified in a log amplifier 41 to increase the dynamic range and decrease the effects of noise near the top of the pulse. This compressed signal 42 is then applied to terminated delay line 43 along which a number of equally spaced taps are provided as illustrated. Four taps are utilized in this illustrative example. A larger number of taps would result in improved accuracy. Equally spaced taps on the delay line results in equal time delays between the signals tapped off of the delay line at adjacent taps.

For an approximately trapezoidal shaped pulse incident to the delay line, the difference of the sum of the signals tapped off of the input half of the delay line length (Sum A) and the sum of the signals tapped off of the output half of the delay line length (Sum B) is shown by curve 44 in FIG. 2. The precise determination of the time occurrence of the zero crossing of the voltage (or current) difference waveform is the focus of the invention since this represents the "centroid" of the pulse. Implicit in the zero crossing detection function is operation on the input signals in a differential manner as shown by the composite waveform 44 of FIG. 2, which is internal to the "zero crossing detector" of FIG. 1.

The invention hereinafter described is insensitive to noise on the incoming signal waveform away from the center of the pulse. It is able to form the sum and difference of the incoming summed tapped signals to effect a waveform polarity reversal that is congruent with the effective center of area (centroid) of the pulse. Further the apparatus of the invention is very fast, and is capable of a time resolution on the order of 1 nanosecond. This characteristic reflects the accuracy to which the true pulse (target) can be measured. Setting and resetting of the circuit is automatically initiated by the input signal itself. Finally, the detector may operate with accessory logic circuit compatible with high speed "add", "OR", inhibition, synchronization, etc. functions.

Referring now to FIG. 3 there is shown the basic detector of the invention. It comprises a delay line such as tapped coaxial cable 45, tunnel diode 20, differential amplifier 27 and an associated resistance network. Tunnel diode 20 is connected in a balanced fashion with respect to the four signal inputs from the equally spaced delay line taps 21, 22, 23 and 24 and ground. Resistor 13 is the transmission line terminating load impedance and is equal to the characteristic impedance of the line (i.e., $R_{13}=Z$). The circuit specifically associated with tunnel diode 20 is provided with resistors 1-8. Resistors 1, 2, 3, 4 are equal in value and of sufficiently high value to minimize the "loading" on the delay line. Wide bandwidth and high input impedance further decrease the loading effects. These resistors serve the purpose of Kirchoff summation of the input and delayed input signals at points B and C. Resistors 7 and 8 in series with current sources, $I_1$ and $I_2$, provide a constant bias current through the tunnel diode 20. Practically, $I_1$ is equal to $I_2$. Resistors, 5 and 6, establish the load line for the tunnel diode 20. The nodes (B) and (C) are connected through coupling and dc blocking capacitors 14 and 15 to the differential amplifier 27 terminals M and N, respectively. The differential amplifier 27 is appropriately biased with voltage sources $V_1$ and $V_2$ and resistors 9, 10, 11 and 12.

Figure 4:
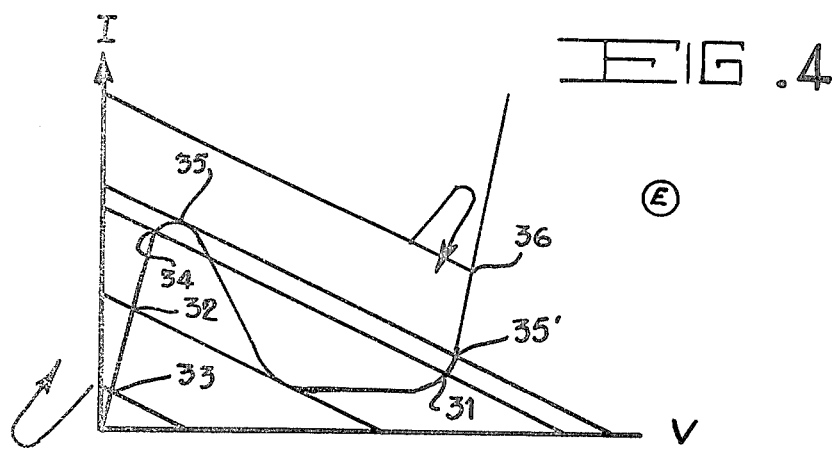
FIG. 4 illustrates in curve form the mode of operation of FIG. 3.

In the quiescent condition (no signal input to or on the delay line), differential amplifier 27 input terminal M is at a lower potential than terminal N, and the tunnel diode is at a high voltage state corresponding to point 31 on the V-I-load line characteristics in FIG. 4.

Consider the following operation when an input signal of negative polarity ($-V$) is incident upon the delay line at point (A). As this pulse "travels" down the delay line, passing tap points 21 and 22, the current sum at node (B) is increasing in magnitude and polarity such that current is "pulled" through the tunnel diode in the reverse direction from what is normally the forward conducting direction of the tunnel diode. A replica of the current summation at point (B) occurs at node (C) at a delayed time ($\sim 2\gamma$) corresponding to the signal pulse on the delay line passing tap points 23 and 24 ($2\gamma$ is set to be about one half the width of the incident signal pulse.). This current sum component is connected to the opposite side and tends to pull current through the tunnel diode in the forward conducting direction. Accordingly, the net signal in the tunnel diode corresponds to the difference of the sums of the two sets of tapped signal samples from the delay line.

When the tunnel diode is in the quiescent state, 31, it is insensitive to base line noise perturbations since it is "away" from the unstable region of the tunnel diode (between points 35 and the "valley" of the V-I characteristics).

When an authentic video signal pulse (echo) arrives at the detector (as described above) the current in the tunnel diode 20 decreases until the load line touches the valley point. At this time, the tunnel diode is switched to state 32 on FIG. 4, and may further change to point 33, depending upon the magnitude of the reverse current. This transition, coupled through the capacitors to the differential amplifier does not disturb the amplifier state because the amplifier is biased such that M is at a lower potential than N (as described above).

When the signal pulse reaches delay line taps 23 and 24 causing an increasing current to be drawn through the tunnel diode in the forward direction (as described above) the state of the tunnel diode reverts to point 32. At the time when the point reaches the symmetric point with respect to the taps, or the differential sums at B and C, is near the zero crossing point, the tunnel diode state is at point 34, close to the peak of the tunnel diode characteristic. A very slight additional signal will then cause a rapid transition from state 34-35 to state 35'. This transition, when coupled through capacitors 14 and 15, will switch the differential amplifier and cause it to remain switched for a time determined by the time constants determined by circuit elements 14, 11, 5 and 15, 10, 6. The leading edge or risetime of this transition corresponds to the pulse centroid sought. In FIG. 4, the separation between state 35 and state 36 and between states 32 and 33 represents overdrive tolerances which permits a large dynamic range capability for the echo signals. This operation can be repeated asynchronously for successive echoes.

The following characteristics should be noted: In FIG. 4, the distance (in current units) between the state point 31 and 34 load line and the state point 32 load line represents the noise immunity margin as well as the signal level (in terms of difference of sums) required to "set" (onset of triggering) the zero differential detector. The current difference between the load line through 34 and that through 35 represents the signal overdrive required, which, in turn, refers to an absolute offset of the zero crossing. For more sensitivity, the point 31 should be located near the valley of the tunnel diode characteristic. For small overdrive, point 34 should be located near the peak of the V-I characteristic of the tunnel diode. The specific tunnel diode choice and the load line slopes are governed by these considerations.

In summary, the zero differential detector has the following outstanding characteristics: signal controlled initiation and pulse skirtnoise immunity; ultrafast decision time (a fraction of a nanosecond); time precision better than $\pm 1$ ns—corresponding to accuracy of pulse centroid determination; wide input signal dynamic range permitted by balanced—differential mode of operation; high sensitivity corresponding to micro volts or pico amps and associated with the above speed and precision characteristics; compatible with high speed integrated logic circuits; and allow for the use of single polarity operational amplifiers in place of the tapping resistors for better loading and sensitivity.

While the invention has been described in its preferred embodiment it is understood that the words which have been used are words of description rather than words of limitation and that changes with the purview of the appended claims may be made without departing from the scope and spirit of the invention in its broader aspects.

What is claimed is:

1. A balanced input zero differential detector comprising
   a tapped delay line for receiving an input signal, said tapped delay line having n equally spaced taps comprising a series of taps 1 through n, n being an even integer,
   an equal value tap resistor connected to each tap,
   a tunnel diode,
   first and second tunnel diode load line resistors,
   a first resistance network comprising the tap resistors of taps 1 through n/2 connected in parallel and to ground through said first tunnel diode load line resistor,
   a second resistance network comprising the tap resistors of taps (n/2)+1 through n connected in parallel and to ground through said second tunnel diode load line resistor, and a differential amplifier having first and second inputs, said tunnel diode being connected between said first and second resistance networks and across the inputs of said differential amplifier.

2. A balanced input zero differential detector as defined in claim 1 wherein said tapped delay line is a coaxial cable.

3. A balanced input zero differential detector as defined in claim 2 wherein said tunnel diode is positioned and biased relative to said taps and ground such that in the absence of an input signal it is in a first stable low current-high voltage state and the occurrence of an input signal causes a series of state changes that effect diode switching to a second state at the time of an input signal centroid.

* * * * *